United States Patent
Hayne

(10) Patent No.: US 10,243,086 B2
(45) Date of Patent: Mar. 26, 2019

(54) ELECTRONIC MEMORY DEVICES

(71) Applicant: Lancaster University Business Enterprises Limited, Lancashire (GB)

(72) Inventor: Manus Hayne, Lancashire (GB)

(73) Assignee: Lancaster University Business Enterprises Limited, Lancaster, Lancashire (GB)

(*) Notice: Subject to any disclaimer, the term of this patent is extended or adjusted under 35 U.S.C. 154(b) by 0 days.

(21) Appl. No.: 15/521,208

(22) PCT Filed: Oct. 23, 2015

(86) PCT No.: PCT/GB2015/053191
§ 371 (c)(1),
(2) Date: Apr. 21, 2017

(87) PCT Pub. No.: WO2016/063086
PCT Pub. Date: Apr. 28, 2016

(65) Prior Publication Data
US 2017/0352767 A1    Dec. 7, 2017

(30) Foreign Application Priority Data
Oct. 23, 2014   (GB) .................................. 1418888.2

(51) Int. Cl.
*G11C 16/04* (2006.01)
*H01L 29/80* (2006.01)
(Continued)

(52) U.S. Cl.
CPC ............ *H01L 29/803* (2014.09); *G11C 16/14* (2013.01); *G11C 16/28* (2013.01);
(Continued)

(58) Field of Classification Search
CPC ............ H01L 29/803; H01L 21/28273; H01L 29/66916; G11C 16/14; G11C 16/28
(Continued)

(56) References Cited

U.S. PATENT DOCUMENTS 4,905,063 A * 2/1990 Beltram ............ G11C 16/0433
257/191
5,489,785 A    2/1996 Tehrani et al.
(Continued)

FOREIGN PATENT DOCUMENTS

WO    2006125051 A1    11/2006

OTHER PUBLICATIONS

Lott et al., "Charge Storage in InAlAs/InGaAs/InP Floating Gate Heterostructures", Electronics Letters, IEE Stevenage, vol. 26, No. 14, Jul. 5, 1990, 2 pgs.

*Primary Examiner* — Huan Hoang
(74) *Attorney, Agent, or Firm* — Young Basile Hanlon & MacFarlane, P.C.

(57) ABSTRACT

A memory cell for storing one or more bits of information has a control gate, a source terminal and a drain terminal. A semiconductor substrate is located between the source and drain terminals, and a floating gate is disposed between the control gate and the semiconductor substrate. The floating gate is electrically isolated from the control gate by a charge trapping barrier, and is electrically isolated from the semiconductor substrate by a charge blocking barrier. At least one of the charge trapping barrier and the charge blocking barrier contains a III-V semiconductor material. The charge trapping barrier is adapted to enable the selective passage of charge carriers between the control gate and the floating gate, in use, to modify the one or more bits of information stored by the memory cell.

24 Claims, 6 Drawing Sheets

(51) Int. Cl.
| | |
|---|---|
| *H01L 21/28* | (2006.01) |
| *H01L 29/43* | (2006.01) |
| *G11C 16/14* | (2006.01) |
| *G11C 16/28* | (2006.01) |
| *H01L 29/66* | (2006.01) |
| *H01L 29/423* | (2006.01) |

(52) U.S. Cl.
CPC ...... *H01L 21/28273* (2013.01); *H01L 29/432* (2013.01); *H01L 29/66916* (2013.01); *H01L 29/66924* (2013.01); *H01L 29/42324* (2013.01)

(58) Field of Classification Search
USPC .................................................. 365/185.26
See application file for complete search history.

(56) References Cited

U.S. PATENT DOCUMENTS

| | | | |
|---|---|---|---|
| 5,834,793 A * | 11/1998 | Shibata | B82Y 10/00 |
| | | | 257/25 |
| 2007/0132010 A1 | 6/2007 | Bhattacharyya | |
| 2008/0067577 A1 | 3/2008 | Wang et al. | |
| 2008/0073689 A1 | 3/2008 | Wang et al. | |
| 2008/0116505 A1 | 5/2008 | Wang | |
| 2009/0262593 A1* | 10/2009 | Crippa | G11C 7/04 |
| | | | 365/211 |
| 2010/0123181 A1 | 5/2010 | Park et al. | |
| 2016/0087056 A1* | 3/2016 | Wu | H01L 29/42328 |
| | | | 257/320 |

* cited by examiner

ELECTRONIC MEMORY DEVICES

CROSS REFERENCE TO RELATED APPLICATION

The present application claims priority to Great Britain Patent Application No. 1418888.2, filed Oct. 23, 2014, incorporated herein its entirety.

TECHNICAL FIELD

The present invention relates to electronic memory devices, and in particular to electronic memory devices that utilise floating gates to store charge.

BACKGROUND

In the modern era, society is becoming ever more dependent on access to, and the manipulation and storage of, increasingly vast amounts of data, at ever increasing speeds. Indeed, the ability to access large amounts of robustly stored data at a high speed is vital in many industries, as well as highly desirable for individuals when, for example, accessing the internet and the like. Access to information can promote freedom of choice, improve efficiency, drive innovation and economic development, and may overall lead to an improved quality of life.

Memory devices are typically semiconductor-based, integrated circuits for use by computers or other electronic devices. There are many different types of memory, including random-access memory (RAM), read only memory (ROM), non-volatile floating gate NOR/NAND flash memory, and dynamic random-access memory (DRAM).

Flash memory is a semiconductor device that utilises an electrically isolated floating gate within which charge is selectively stored. A conventional flash memory cell comprises a semiconductor substrate (usually silicon), which is doped to form separated source and drain terminals. A control gate terminal is also provided, with an electrically isolated floating gate disposed between the control gate and the substrate. A voltage applied to the control gate that is greater in magnitude than a threshold voltage enables current flow along a conductive channel, also known as an inversion layer, in the semiconductor substrate between the source and the drain terminals.

If charge is located within the floating gate, then the floating gate partially screens the control gate from the channel, thereby increasing the magnitude of the threshold voltage, ie the voltage at the control gate that is needed for current to flow through the channel. There are therefore at least two states of the device, a state in which charge is held in the floating gate and hence the device has a first threshold voltage, and a state in which no charge is held in the floating gate and hence the device has a second, lower threshold voltage. The state can be determined by applying an intermediate voltage to the control gate, ie a voltage that lies between the first and second threshold voltages, and sensing the current flow within the channel. The two states may be viewed as a bit, and thus the presence or absence of charge in the floating gate may provide a memory function for a device.

Due to the electrical isolation of the floating gate, which is typically achieved by placement of an oxide layer between the channel and the floating gate, and an oxide layer between the control gate and the floating gate, charge may be held within the floating gate for extremely long periods of time without the risk of charge being removed from the floating gate. Thus, flash memory is a non-volatile form of memory, which allows for robust storage of data.

Flash memory typically makes use of one of two mechanisms for the transfer of charge between the channel and the floating gate, namely Fowler-Nordheim tunnelling and hot-carrier injection (HCI).

Fowler-Nordheim tunnelling is a quantum mechanical effect relying on the tunnelling of electrons through a potential barrier. The probability of an electron passing through a barrier is greater for barriers of a smaller width, and thus, in order to facilitate the transfer of electrons between the channel and the floating gate, it is desirable to have as thin a layer of oxide as possible.

This, however, contradicts the requirement for non-volatility, which requires that the oxide layer is thick enough to prevent charge from leaking from the floating gate to the channel, and vice versa. The increased thickness that is necessary for non-volatility thus results in a lower probability of electrons being transferred between the channel and the floating gate, thereby increasing write and erase times.

Hot-carrier injection relies on the application of a voltage between the source and drain, which increases the kinetic energy of electrons in the channel such that they are able to pass through the oxide layer and into the floating channel. However, this requires a high voltage to be applied, which may in turn create a high electric field through the structure. Furthermore, increased voltages may result in electrons having increased kinetic energy to such a degree that, when electrons collide with the oxide layer, degradation of the oxide layer may occur, thereby limiting the number of times that electrons may be transferred (ie data may be written and erased) from the channel to the floating gate.

Various alternative methods to conventional flash memory have been proposed, for example the production of nitride trapping layers in SONOS or TANOS devices, yet none of these methods have been able to combine long term charge retention, ie non-volatility, with the fast write and/or erase times that are desirable.

There has now been devised a memory cell, method of manufacturing a memory cell, and a method of operating a memory cell, which overcome or substantially mitigate the aforementioned and/or other disadvantages associated with the prior art.

SUMMARY

According to a first aspect of the present invention, there is provided a memory cell for storing one or more bits of information, the memory cell comprising a control gate, a source terminal and a drain terminal, a semiconductor substrate between the source and drain terminals, and a floating gate disposed between the control gate and the semiconductor substrate, which is electrically isolated from the control gate by a charge trapping barrier, and which is electrically isolated from the semiconductor substrate by a charge blocking barrier, at least one of the charge trapping barrier and the charge blocking barrier comprising a III-V semiconductor material, wherein the charge trapping barrier is adapted to enable the selective passage of charge carriers between the control gate and the floating gate, in use, to modify the one or more bits of information stored by the memory cell.

According to a further aspect of the present invention, there is provided a method of manufacturing a memory cell for storing one or more bits of information, the method comprising the steps of:

(a) providing a control gate, a source terminal and a drain terminal, and a semiconductor substrate between the source and drain terminals, and
(b) providing a floating gate disposed between the control gate and the semiconductor substrate, which is electrically isolated from the control gate by a charge trapping barrier, and which is electrically isolated from the semiconductor substrate by a charge blocking barrier, at least one of the charge trapping barrier and the charge blocking barrier comprising a III-V semiconductor material, wherein the charge trapping barrier is adapted to enable the selective passage of charge carriers between the control gate and the floating gate, in use, to modify the one or more bits of information stored by the memory cell.

According to a further aspect of the present invention, there is provided a method of operating a memory cell, the method comprising the steps of:
(a) providing a memory cell for storing one or more bits of information, the memory cell comprising a control gate, a source terminal and a drain terminal, a semiconductor substrate between the source and drain terminals, and a floating gate disposed between the control gate and the semiconductor substrate, which is electrically isolated from the control gate by a charge trapping barrier, and which is electrically isolated from the semiconductor substrate by a charge blocking barrier, at least one of the charge trapping barrier and the charge blocking barrier comprising a III-V semiconductor material; and
(b) applying an electric field across the charge trapping barrier, such that charge carriers are selectively passed between the control gate and the floating gate, through the charge trapping barrier to modify the one or more bits of information stored by the memory cell.

The present invention is advantageous principally because the provision of a charge trapping barrier that enables the selective passage of charge carriers between the control gate and the floating gate, rather than between a channel between the source and drain terminals and the floating gate, as in prior art flash memories, provides an alternative memory structure that may enable greater storage times, lower voltages for write and erase operations, and greater sensitivity for read operations. For example, the charge trapping barrier being adapted to enable the selective passage of charge carriers between the control gate and the floating gate, in use, to modify the one or more bits of information stored by the memory cell, may enable the charge blocking barrier to be a higher potential barrier than in prior art flash memories, for example, or a thicker barrier than in the prior art flash memories, for example, as it is not necessary for charge carriers to pass between the floating gate and the conductive channel in the semiconductor substrate. The charge blocking barrier may therefore, for example, be formed as a higher electric potential barrier, and may thus be formed as a thinner layer, than is known in prior art flash memories, for example, whilst still providing a non-volatile memory cell. Furthermore, the thinner nature of such a charge blocking barrier means that the floating gate and the conductive channel in the semiconductor substrate may be in close proximity, thereby increasing the sensitivity of the read operation of the memory cell.

The memory cell may be adapted such that a channel between the source and drain terminals is conductive only upon application of an electric field across the charge trapping barrier, ie a so-called enhancement type device. The memory cell may comprise an enhancement mode channel. Alternatively, the memory cell may be adapted such that a channel between the source and drain terminals is conductive even when there is no electric field applied across the charge trapping barrier, ie a so-called depletion type device. The memory cell may comprise a depletion mode channel. Enhancement type devices may be beneficially used for NOR type flash memory, whereas depletion type devices may be beneficially used for NAND type flash memory. The control gate may be adapted to induce a change in the conductivity of a channel in the semiconductor substrate between the source and drain terminals.

The memory cell may be non-volatile. The memory cell may store the one or more bits of information without requiring power. The storage time of the memory cell may be at least 10,000 years, thereby allowing a memory chip to store data for at least 10 years. Indeed, storage times of at least 100,000 years, or at least 1,000,000 years, may be achievable.

Whilst the present application focuses mainly on non-volatile memory cells, it is also recognised that the principles may be more widely applied to form a semi-volatile memory cell. Such a semi-volatile memory cell may be suitable for use as a DRAM type memory. Where the memory cell is semi-volatile, the storage time of the memory cell may be at least 1 hour, at least 1 day, a least 1 week, or at least one year. This may provide significant advantages over current DRAM type memory, where capacitors need to be refreshed approximately every 60 milliseconds.

The charge trapping barrier may have any form that enables the selective passage of charge carriers between the control gate and the floating gate. The charge trapping barrier may comprise at least one electric potential barrier that enables the selective passage of charge carriers between the control gate and the floating gate, for example by controlling the energy of the charge carriers in the control gate and/or floating gate, and/or by controlling the shape and/or magnitude of the at least one electric potential barrier. The selective passage of charge carriers between the control gate and the floating gate may be enabled by use of quantum mechanical effects. In particular, the energy of the charge carriers transmitted through the at least one electric potential barrier may be less than the height of the at least one electric potential barrier. The passage of charge carriers between the control gate and the floating gate may be by quantum tunnelling, also known as wave-mechanical tunnelling, and hence the charge trapping barrier may be a quantum tunnelling barrier.

The charge trapping barrier may comprise at least one electric potential barrier that has a resonant energy, less than the height of the potential barrier, at which passage of charge carriers between the control gate and the floating gate is enabled. The transmission coefficient for the charge carriers at the resonant energy may represent a peak, relative to the transmission coefficient at neighbouring energies. The transmission coefficient at the resonant energy may be many orders of magnitude greater than the transmission coefficient at neighbouring energies. The passage of charge carriers between the control gate and the floating gate may be by resonant tunnelling, and hence the charge trapping barrier may be a resonant tunnelling barrier.

Resonant tunnelling enables fast write and erase speeds, such as less than 10 µs, less than 1 µs, less than 500 ns, or less than 100 ns, for example in the region of 1 ns, for each write and/or erase operation.

The charge trapping barrier may comprise at least one electric potential barrier that enables selective inter-band passage of charge carriers between the control gate and the floating gate, eg between the conduction and the valence bands. The charge trapping barrier may therefore comprise a p-n junction, eg a heavily doped p-n junction. However, the charge trapping barrier preferably comprises at least one electric potential barrier that enables selective intra-band passage of charge carriers between the control gate and the floating gate, eg within the conduction band or within the valence band. The charge trapping barrier may comprise at least one electric potential barrier in which energy states are quantised. This leads to a reduction in the density of states inside the barrier. As a result, only certain energy levels are allowed to be filled. The charge trapping barrier may comprise one or more quantum dots, quantum wires or quantum wells.

Since conventional integrated devices are formed in layers, and fabrication techniques exist that provide heterojunctions with smooth interfaces and very few defects, the use of quantum wells provides less variability between cells. The charge trapping barrier and the floating gate are preferably formed epitaxially, for example by molecular beam epitaxy (MBE), liquid phase epitaxy (LPE) or chemical vapour deposition (CVD), or the like.

The charge carriers may be electrons or holes. However, in presently preferred embodiments, the charge carriers are electrons, and the charge trapping barrier comprises at least one electric potential barrier that enables intra-band passage of electrons between the control gate and the floating gate in the conduction band.

The charge trapping barrier may comprise two or more electric potential barriers, in a multiple barrier arrangement. For example, the charge trapping barrier may comprise two, three, four, five or more electric potential barriers.

The charge trapping barrier may comprise a material other than a dielectric material. The charge trapping barrier may comprise one or more semiconductors. The charge trapping barrier may comprise one or more quantum wells. The one or more quantum wells may be formed by layers of one or more semiconductors, adjacent layers having offset conduction and/or valence bands to form heterojunctions at the interfaces between those adjacent layers. The offset conduction and/or valence bands of the layers of semiconductors may be achieved by selecting different semiconductors for adjacent layers, thereby defining one or more quantum wells in the conduction and/or valence bands.

Each quantum well may therefore be formed by a narrow band gap semiconductor being disposed between two wide band gap semiconductors, thereby providing a heterojunction structure. By "band gap" is meant the energy gap between the valence and conduction bands of the semiconductor. The charge trapping barrier may therefore comprise a plurality of layers of two or more different semiconductors, which together define one or more quantum wells.

The plurality of layers of semiconductors in the charge trapping barrier may be formed of any semiconductors that provide the required barrier potentials, eg the required heterojunctions, including any resonant energies. The layers of semiconductors may alternate between two different semiconductors, eg between different elemental or compound semiconductors. Alternatively, the layers of semiconductors may comprise a semiconductor alloy, with different proportions of elements in adjacent, or alternate, layers.

The layers of the charge trapping barrier may have a conduction band offset and/or a thickness that provide a transmission coefficient peak at a resonant energy. The layers of the charge trapping barrier may have a conduction band offset of at least 1.0 eV, at least 2.0 eV, or at least 3.0 eV. The charge trapping barrier may have a thickness less than 50 nm, less than 30 nm or less than 10 nm. For example, for non-volatile memory, the charge trapping barrier may have a thickness in the range 10-20 nm and, for semi-volatile memory, the charge trapping barrier may have a thickness in the range 5-15 nm.

Since the control gate modifies the one or more bits of information stored by the memory cell by enabling the selective passage of charge carriers between the control gate and the floating gate, rather than between the floating gate and the conductive channel of the semiconductor substrate, the charge trapping barrier between the control gate and the floating gate may have a thickness that is sufficient to provide a desired resonant tunnelling barrier, without affecting the read operation sensitivity of the memory cell. The charge trapping barrier may have a thickness that is substantially the same as the thickness of the charge blocking barrier. Alternatively, the charge trapping barrier may have a thickness that is greater than the thickness of the charge blocking barrier. For example, the charge trapping barrier may have a thickness that is at least 30%, 50%, 100%, or 500% greater than the thickness of the charge blocking barrier.

The charge trapping barrier may comprise one or more confined internal states, into which (and out of which) charge carriers can pass, for example by quantum tunnelling. The confined internal states may be formed by any of quantum dots, quantum wires, or quantum wells. The charge trapping barrier may therefore be considered to be a 'hollow' barrier. In contrast, the charge blocking barrier may comprise no confined internal states, into which charge carriers can pass, such that charge carriers may not pass into the charge blocking barrier, for example by quantum tunnelling. The charge blocking barrier may therefore be considered to be a 'solid' barrier.

The semiconductors may be crystalline solids, eg crystalline inorganic solids. The semiconductors may have high electron mobility, for faster operation. The semiconductors may have a wide band gap, for operation at higher temperatures and with lower thermal noise.

The semiconductors may comprise elemental semiconductors, eg Group IV or Group VI semiconductors, or compound semiconductors, eg Group III-V, II-VI, I-VII, IV-VI, V-VI or II-V semiconductors. In presently preferred embodiments, the semiconductors comprise III-V semiconductors, or alloys of III-V semiconductors. The layers of semiconductors may be substantially lattice matched in order to reduce defects, and hence reduce errors. The plurality of layers may be substantially lattice matched. The plurality of layers of semiconductors in the charge trapping barrier may have a maximum lattice mismatch of 5%, 1% or 0.5%.

The semiconductors may comprise aluminium. The semiconductors may include any of boron nitride (BN), boron phosphide (BP), boron arsenide (BAs), aluminium nitride (AlN), aluminium phosphide (AlP), aluminium arsenide (AlAs), aluminium antimonide (AlSb), gallium nitride (GaN), gallium phosphide (GaP), gallium arsenide (GaAs), gallium antimonide (GaSb), indium nitride (InN), indium arsenide (InAs) and indium antimonide (InSb).

The semiconductors may include an alloy of semiconductor materials, and may include any of aluminium gallium arsenide (AlGaAs), indium gallium arsenide (InGaAs), indium gallium phosphide (InGaP), aluminium indium arsenide (AlInAs), aluminium indium antimonide (AlInSb), gallium arsenide nitride (GaAsN), gallium arsenide phosphide (GaAsP), gallium arsenide antimonide (GaAsSb), aluminium gallium nitride (AlGaN), aluminium gallium phosphide (AlGaP), indium gallium nitride (InGaN), indium arsenide antimonide (InAsSb), indium gallium antimonide (InGaSb), aluminium gallium indium phosphide (AlGaInP), aluminium gallium arsenide phosphide (AlGaAsP), indium gallium arsenide phosphide (InGaAsP), indium gallium arsenide antimonide (InGaAsSb), indium arsenide antimonide phosphide (InAsSbP), aluminium indium arsenide phosphide (AlInAsP), aluminium gallium arsenide nitride (AlGaAsN), indium gallium arsenide nitride (InGaAsN), indium aluminium arsenide nitride (InAlAsN), gallium arsenide antimonide nitride (GaAsSbN), gallium indium nitride arsenide antimonide (GaInNAsSb), and gallium indium arsenide antimonide phosphide (GaInAsSbP).

It will be appreciated that where an alloy of two or more elements is mentioned, the elements of the alloy may be present in any relative proportion.

The use of III-V semiconductors may provide high carrier mobility, for faster operation, and wide band gaps, for operation at higher temperatures and with lower thermal noise. The carrier mobility at room temperature may be at least 500 $cm^2/Vs$, at least 1,000 $cm^2/Vs$, at least 5,000 $cm^2/Vs$, at least 10,000 $cm^2/Vs$, or at least 20,000 $cm^2/Vs$. The semiconductors may comprise an alloy of semiconductor materials that have selected proportions of elements that provide the desired band gap and/or desired lattice constant for each layer.

One or more layers of semiconductor in the charge trapping barrier may comprise a narrow band gap semiconductor, such as indium arsenide (InAs) or gallium antimonide (GaSb). One or more layers of semiconductor in the charge trapping barrier may comprise a wide band gap semiconductor, such as aluminium gallium antimonide (AlGaSb) or aluminium gallium arsenide (AlGaAs). In a currently preferred embodiment, the charge trapping barrier may be formed of layers of indium arsenide (InAs) and aluminium gallium antimonide (AlGaSb). These III-V semiconductors have a very high conduction band offset, and are nearly lattice matched. The layers of the charge trapping barrier may have a conduction band offset of at least 1.0 eV, at least 2.0 eV, or at least 3.0 eV. The plurality of layers of semiconductors in the charge trapping barrier may have a maximum lattice mismatch of 5%, 1% or 0.5%.

The selective passage of charge carriers between the control gate and the floating gate, in use, may be controllable, for example by controlling the energy of charge carriers in the control gate and/or the floating gate, and/or by controlling the shape and/or magnitude of one or more electric potential barriers of the charge trapping barrier. The passage of charge carriers between the control gate and the floating gate may be controllable by the application of an electric field across the charge trapping barrier, eg by application of a potential difference across the charge trapping barrier. A potential difference may be applied between the control gate and the source terminal of the memory cell, for example.

The application of an electric field across the charge trapping barrier may modify the form of the one or more electric potential barriers, and/or the energy of charge carriers in the control gate and/or the floating gate, such that the transmission coefficient for charge carriers in the control gate or the floating gate, for each barrier electric potential, is increased. The shape and/or magnitude of the one or more electric potential barriers may be modified, eg the one or more electric potential barriers may become inclined across the applied electric field. In particular, the increase or decrease in the height of the one or more electric potential barriers may be proportional to its distance across the applied electric field. This application of an electric field is commonly called a lever voltage.

The charge trapping barrier may be modelled to provide a substantial alignment of resonant energies of the electric potential barriers when a pre-determined electric field is applied across the charge trapping barrier. The pre-determined electric field may be constant during a write or erase operation. Alternatively, the write or erase operation may be a multi-step process, requiring a plurality of different electric fields to be applied across the charge trapping barrier, sequentially, in order to enable passage of charge carriers through the charge trapping barrier.

The memory cell may have at least one write voltage that, when applied between the control gate and the source, causes flow of charge carriers, eg electrons, from the control gate, through the charge trapping barrier, into the floating gate. The number of charge carriers retained within the floating gate when the electric field is removed may be dependent on the form of the floating gate. The memory cell may have at least one erase voltage that, when applied between the control gate and the source, causes flow of charge carriers, eg electrons, from the floating gate, through the charge trapping barrier, into the control gate.

The potential difference applied across the charge trapping barrier during a write operation, or an erase operation, may be substantially lower than conventional voltages necessary to transfer charge carriers into the floating gate. In particular, the potential difference may be less than 7V, less than 5V, or less than 3V. Thus, the charge carriers may have a low kinetic energy and, upon impact with the charge blocking barrier, may cause substantially less damage to the barrier than is known in the prior art. Thus, the number of times that data may be written to the memory cell may be increased relative to conventional flash memory. For example, the memory cell may allow around $10^6$, $10^{10}$, $10^{16}$, or more switching cycles in its lifetime.

The charge trapping barrier may be adapted to prevent charge carriers from entering the floating gate, in the absence of an applied write voltage. Similarly, the charge trapping barrier may be adapted to prevent charge carriers from leaving the floating gate, in the absence of an applied erase voltage. The charge trapping barrier may have a thickness and/or a height that substantially eliminates the probability of an electron tunnelling through the charge trapping barrier from the control gate to the floating gate, in the absence of an applied write voltage, or from the floating gate to the control gate, in the absence of an applied erase voltage. The charge trapping barrier may be adapted to prevent less than 1 electron per 10,000 years from leaving the floating gate in the absence of an applied electric field across the charge trapping barrier, or less than 1 electron per 1,000 years, or less than 1 electron per 100 years, or less than 1 electron per 10 years, or less than 1 electron per year.

The floating gate may be adapted to retain charge carriers, eg electrons, within its boundary. The floating gate may be electrically isolated from the substrate by a charge blocking barrier.

The floating gate may comprise an electric potential trap in which energy states are quantised, between the charge trapping barrier and the charge blocking barrier. This leads to a reduction in the density of states inside the floating gate. As a result, only certain energy levels are allowed to be filled. The floating gate may comprise one or more quantum dots, quantum wires or quantum wells. However, since conventional integrated devices are formed in layers, and fabrication techniques exist that provide heterojunctions with smooth interfaces and very few defects, the use of a quantum well provides less variability between cells.

The floating gate may comprise a quantum well, defined between the charge trapping barrier and the charge blocking barrier. In particular, the charge trapping barrier and the charge blocking barrier may define the walls of the quantum well of the floating gate.

The quantum well may be formed by a layer of semiconductor defining the floating gate, and a layer of semiconductor on each side of the floating gate. The layers of semiconductor on each side of the floating gate may define at least part of the charge trapping barrier and the charge blocking barrier. The adjacent layers may have offset conduction and/or valence bands to form heterojunctions at the interface between those adjacent layers, thereby defining the floating gate. The offset conduction and/or valence bands of the layers of semiconductors may be achieved by selecting different semiconductors for adjacent layers, thereby defining quantum wells in the conduction and/or valence bands.

The quantum well of the floating gate may therefore be formed by a narrow band gap semiconductor being disposed between two wide band gap semiconductors, thereby providing a heterojunction structure. The charge blocking barrier may comprise an electric potential barrier that is substantially the same size as the electric potential barrier of the charge trapping barrier adjacent to the floating gate. Alternatively, the charge blocking barrier may comprise an electric potential barrier that is greater than the electric potential barrier of the charge trapping barrier adjacent to the floating gate. The layer of material defining that part of the charge blocking barrier that is adjacent to the floating gate may therefore be a wider band gap material than the layer of semiconductor defining that part of the charge trapping barrier that is adjacent to the floating gate.

The charge trapping barrier may comprise one or more confined internal states, into which (and out of which) charge carriers can pass, for example by quantum tunnelling. The confined internal states may be formed by any of quantum dots, quantum wires, or quantum wells. The charge trapping barrier may therefore be considered to be a 'hollow' barrier. In contrast, the charge blocking barrier may comprise no confined internal states, into which charge carriers can pass, such that charge carriers may not pass into the charge blocking barrier, for example by quantum tunnelling. The charge blocking barrier may therefore be considered to be a 'solid' barrier.

The layers of the floating gate and the charge trapping barrier may have a conduction band offset of at least 1.0 eV, at least 2.0 eV, or at least 3.0 eV. The layers of the floating gate and the charge blocking barrier may have a conduction band offset of at least 1 eV, at least 2 eV, or at least 3 eV.

The material defining the floating gate may be a similar material, or indeed the same material, as the material that provides the lower potential regions of the charge trapping barrier.

The material defining the floating gate may therefore be a semiconductor, for example one of the suitable semiconductors discussed above in relation to the charge trapping barrier. The floating gate is most preferably formed of a III-V semiconductor material. In presently preferred embodiments, the floating gate is defined by a layer of indium arsenide (InAs) or indium gallium arsenide antimonide (InGaAsSb).

The charge blocking barrier may be adapted to prevent charge carriers, eg electrons, passing between the floating gate and the conductive channel of the semiconductor substrate. Alternatively, where charge carriers are able to pass between the floating gate and the conductive channel of the semiconductor substrate, this passage of charge carriers does not modify the one or more bits of information stored by the memory cell.

The charge blocking barrier may be an electric potential barrier with a height that is substantially equal to the electric potential barriers of the charge trapping barrier. Alternatively, the charge blocking barrier may be an electric potential barrier with a height that is significantly greater than the electric potential barriers of the charge trapping barrier. The charge blocking barrier may have a thickness of less than 20 nm, less than 10 nm, or less than 5 nm. For example, for non-volatile memory, the charge blocking barrier may have a thickness in the range 10-20 nm and, for semi-volatile memory, the charge blocking barrier may have a thickness in the range 5-15 nm.

The charge blocking barrier may be formed of a material other than a dielectric material. The charge blocking barrier may be formed of an insulator, or a semiconductor material that defines a suitably large electric potential barrier relative to the floating gate. The charge blocking barrier may be formed of a semiconductor material. The charge blocking barrier may be formed of a III-V semiconductor material, for example aluminium antimonide (AlSb), or from a suitable oxide, such as silicon dioxide ($SiO_2$).

The charge blocking barrier may have a thickness that is such that the floating gate and the channel are in close proximity. This may allow for substantially quicker read times than those known in conventional flash memory.

The source and drain terminals may be either n or p-doped. The substrate may be formed of any suitable semiconductor, including indium antimonide (InSb), aluminium indium antimonide (AlInSb), gallium antimonide (GaSb), gallium arsenide (GaAs) and silicon (Si). The substrate may be the same, or a similar, material to the material of the floating gate. In presently preferred embodiments, the substrate is defined by a layer of indium arsenide (InAs), or indium gallium arsenide antimonide (InGaAsSb).

Although there are advantages to the use of a III-V semiconductor for the semiconductor substrate, III-V semiconductors may be expensive to source and/or fabricate. In presently preferred embodiments, the semiconductor substrate is formed on a base substrate of one or more other semiconductors, for example a layered base substrate. Indeed, if a layer of the base substrate were silicon, this offers advantages in terms of integration with convention silicon devices. A particularly advantageous base substrate, where the semiconductor substrate is indium arsenide (InAs), is a layer of gallium antimonide (GaSb), a layer of gallium arsenide (GaAs), and a layer of silicon. However, other combinations of III-V semiconductors, and group IV semiconductors, may be suitable.

The layers of material that define one or more of the charge trapping barrier, the floating gate, the charge blocking barrier, and the semiconductor substrate, may be substantially lattice matched. Thus the hetero structure of the active device region of the memory cell may be substantially defect free, and may ensure high reliability of the cell. The lattice mismatch may be less than 5%, less than 3%, or less than 1%.

The memory cell may be formed by any conventional means of semiconductor structure manufacture. However, at least the charge trapping barrier and the floating gate are preferably formed epitaxially, for example by molecular beam epitaxy (MBE), liquid phase epitaxy (LPE), or chemical vapour deposition (CVD), or the like.

Each terminal may be connectable to other parts of a device, eg another part of an integrated circuit. The memory cell may have a base terminal, in addition to the control gate, source and drain terminals, which is typical in MOSFET-type devices. The base terminal may be shorted to the source terminal, for example, and not utilised. Alternatively, the base terminal may be connectable to other parts of a device, eg another part of an integrated circuit, and utilised during operation.

The memory cell may form part of an array of memory cells, configured to store many bits of information within a memory device. Hence, according to a further aspect of the invention, there is provided a memory device comprising a plurality of memory cells as described above, configured to provide write, read and erase operations. The memory device may be either a NOR type memory device, where the memory cells are connected in parallel, or a NAND type memory device, where the memory cells are connected in series. Where the memory device is a NOR type memory device, the memory cells are preferably enhancement type memory cells. Where the device is a NAND type memory device, the memory cells are preferable depletion type memory cells.

The threshold voltage ($V_{th}$) of the memory cell is the control gate voltage relative to source terminal voltage at the point where an inversion layer just forms, or is just removed, in a channel between the source and drain terminals of the memory cell. For an enhancement mode device, the threshold voltage ($V_{th}$) of the memory cell may be the value of the control gate-source voltage, or the control gate-base terminal voltage, when the conducting channel just begins to connect the source and drain terminals of the memory cell, eg allowing more than the inherent leakage current. The memory cell may be arranged to provide a change to the threshold voltage when one or more charge carriers, eg electrons, are retained by the floating gate. Similarly, the memory cell may be arranged to provide a change to the relationship between the control voltage and the drain current when one or more charge carriers, eg electrons, are retained by the floating gate.

The memory cell may achieve a State "0" when there are charge carriers stored in the floating gate, and a State "1" when there are less charge carriers, or no charge carriers, stored in the floating gate. In order to read the state of the memory cell, a read voltage ($V_{read}$) may be applied to the control gate, relative to either the source terminal or the base terminal, the read voltage ($V_{read}$) being between a first threshold voltage ($V_{th}$) of the memory cell in State "0", and a second, lower, threshold voltage ($V_{th}$) of the memory cell in State "1". The read voltage ($V_{read}$) may be applied between the control gate and the source terminal, eg with the base terminal shorted to the source terminal. However, in order to reduce the voltage between the control gate and the floating gate, and hence reduce the risk of charge carriers being transferred between them, the read voltage ($V_{read}$) may be applied between the control gate and the base terminal, with the base terminal not shorted to the source terminal.

The applied read voltage ($V_{read}$) may result in a first current at the source terminal and/or the drain terminal when the memory cell is in State "1", and either a second, lower current, or no or negligible current, when the memory cell is in State "0". The device may therefore include an arrangement for sensing or measuring the current flow between the source and the drain terminals of the memory cell.

In the write operation, electrons may be pushed into the floating gate by applying a write voltage ($V_{write}$) to the control gate, relative to either the source terminal or the base terminal. The write voltage ($V_{write}$) may be applied between the control gate and the source terminal, eg with the base terminal shorted to the source terminal, which may enable a lower write voltage.

In the erase operation, the electrons may be ejected out of floating gate by applying an erase voltage ($V_{erase}$) to the control gate, relative to either the source terminal or the base terminal. The erase voltage ($V_{erase}$) may be applied between the control gate and the source terminal, eg with the base terminal shorted to the source terminal, which may enable a lower erase voltage.

During retention, the charge may be retained in the floating gate. In presently preferred embodiments, no voltage is applied to the control gate, relative to the source terminal, during retention. If a bias is applied it is preferably zero.

DETAILED DESCRIPTION OF THE DRAWINGS

DETAILED DESCRIPTION OF THE EMBODIMENTS

Figure 1:
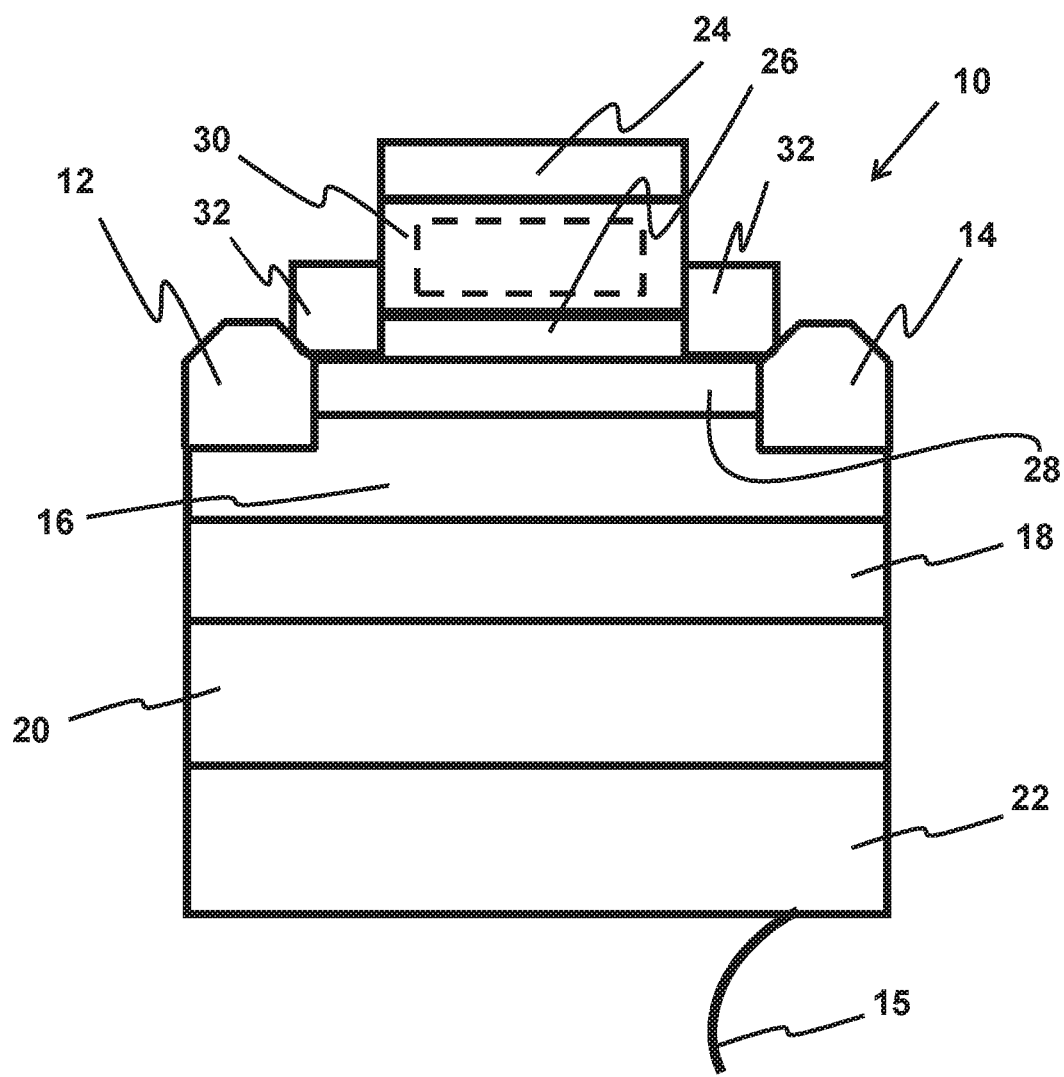
FIG. 1 is a schematic cross-sectional view of a first embodiment of a memory cell according to the invention.

FIG. 1 shows a schematic cross section of a first embodiment of a memory cell according to the invention, which is generally designated 10. The memory cell 10 comprises source and drain terminals 12,14, a semiconductor substrate 16 between the source and drain terminals 12,14, a base terminal 15 at the base of the semiconductor substrate 16, and a control gate 24 for inducing a change in the conductivity of a channel 17 (see FIG. 3) in the semiconductor substrate 16 between the source and drain terminals 12,14. The memory cell also comprises a floating gate 26 disposed between the control gate 24 and the semiconductor substrate 16. The passivation elements 32 are located on an upper surface of the charge blocking barrier 28, and are typically formed of a metal oxide or semiconductor oxide, or polymer, thereby protecting the charge blocking barrier 28 from damage. These aspects of the memory cell 10 are constructed in a similar manner to conventional flash memory, save for the materials used, and this construction is well known in the art.

Nevertheless, unlike conventional flash memory, in the memory cell 10 according to the invention, the floating gate 26 is electrically isolated from the control gate 24 by a charge trapping barrier 30, and the floating gate 26 is electrically isolated from the semiconductor substrate 16 by a charge blocking barrier 28. The charge trapping barrier 30 is adapted to enable the selective passage of charge carriers between the control gate 24 and the floating gate 26, in use, to modify the one or more bits of information stored by the memory cell 10. In contrast, the charge blocking barrier 28 prevents the passage of charge carriers between the floating gate 26 and the conductive channel 17 in the semiconductor substrate 16.

The semiconductor substrate 16 is formed of n-type indium arsenide (InAs), and is disposed upon a base structure 18,20,22 that enables the use of lower cost materials, and may facilitate integration into silicon-based devices. In particular, the uppermost base layer 18 of the base structure 18,20,22 is formed of gallium antimonide (GaSb), and the semiconductor substrate 16 is grown upon the uppermost base layer 18 epitaxially, for example by molecular beam epitaxy (MBE) or any other appropriate process. The uppermost base layer 18 is disposed upon an intermediate base layer 20, which is formed of gallium arsenide (GaAs), and is grown upon this layer using the interface-misfit method (IMF). The intermediate base layer 20 is disposed upon the lowermost base layer 22, which is formed of silicon (Si).

Figure 2:
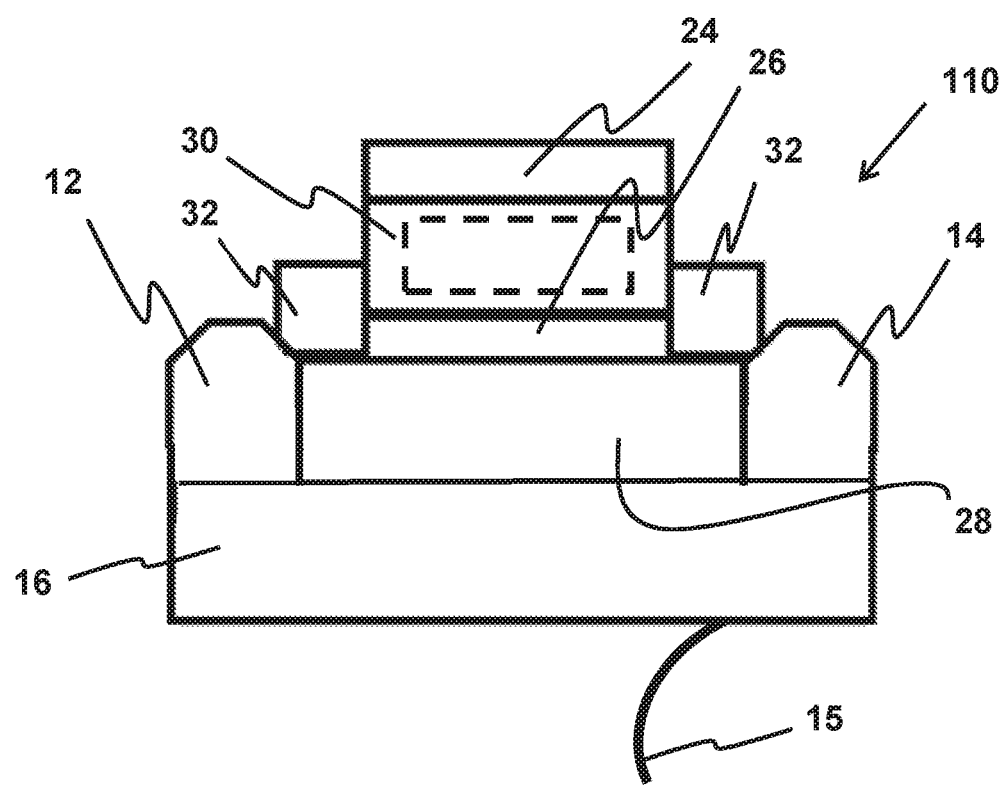
FIG. 2 is a schematic cross-sectional view of a second embodiment of a memory cell according to the invention.

FIG. 2 shows a schematic cross section of a memory cell according to a second aspect of the invention, which is generally designated 110. This memory cell 110 has an identical construction to the memory cell 10 of the first aspect of the invention (the same reference numerals are used for corresponding features of the two embodiments), save for the semiconductor substrate 16 having a greater thickness and being formed from indium arsenide (InAs) only. This embodiment may be more expensive to manufacture, but does not require any lattice matching with a base structure. Alternative embodiments have a semiconductor substrate formed of indium arsenide (InAs), and a base structure of either gallium antimonide (GaSb) only, or a base structure having an uppermost base layer of gallium antimonide (GaSb), and a lowermost base layer of gallium arsenide (GaAs). The following description applies equally to both embodiments.

Figure 3:
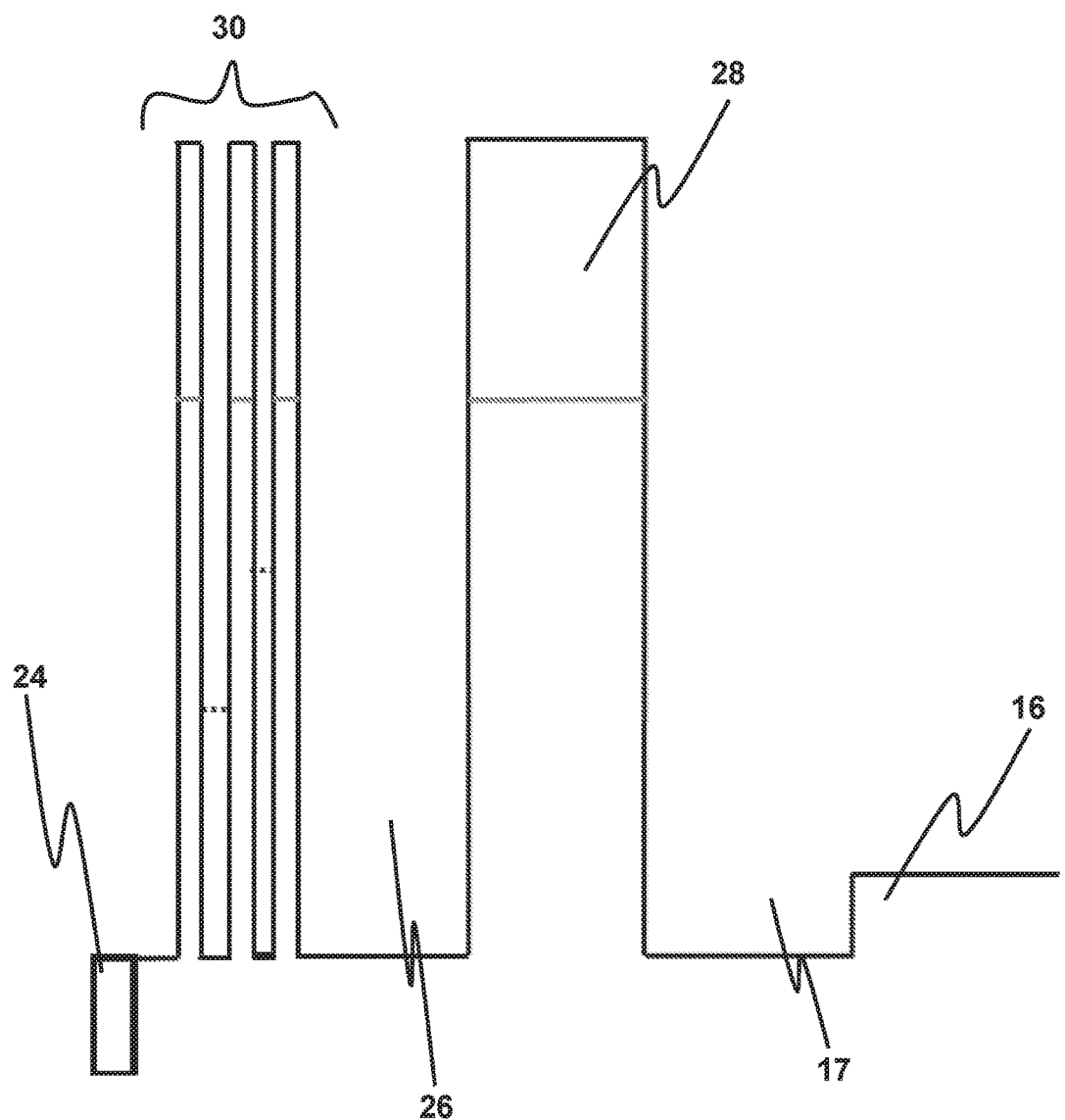
FIG. 3 is a schematic conduction band energy level diagram of the first and second embodiments of a memory cell according to the invention.

The charge blocking barrier 28 is formed of aluminium antimonide (AlSb), and is disposed upon an upper surface of the semiconductor substrate 16. The charge blocking barrier 28 has a thickness that is substantially equal to the thickness of the charge trapping barrier 30. Furthermore, as shown in FIG. 3, the charge blocking barrier 28 has an electric potential barrier that is substantially equal to the electric potential barrier of the charge trapping barrier 30.

The floating gate 26 is disposed on an upper surface of the charge blocking barrier 28, and is formed of indium arsenide (InAs). The floating gate 26 is an electrically isolated quantum well, defined between the charge trapping barrier 30 and the charge blocking barrier 28, which is suitable for retaining a finite number of charge carriers in quantised energy levels.

Situated above the floating gate 26 is the charge trapping barrier 30, which is formed of alternating layers of indium arsenide (InAs) and aluminium gallium antimonide (AlGaSb). The layers of the charge trapping barrier 30 are substantially lattice matched and have a large conduction band offset.

The control gate 24 is formed of any suitable conductive material, and is located on an upper surface of the charge trapping barrier 30. The passivation elements 32 are located on an upper surface of the charge blocking barrier 28, and are typically formed of a metal oxide or semiconductor oxide, or polymer, thereby protecting the charge blocking barrier 28 from damage.

The charge trapping barrier 30, the floating gate 26, and the charge blocking barrier 28, may be formed on the semiconductor substrate 16 by any suitable method, for example by molecular beam epitaxy (MBE), liquid phase epitaxy (LPE), or chemical vapour deposition (CVD), or the like.

As shown in FIG. 3, the charge trapping barrier 30 defines electric potential barriers, which define a series of quantum wells that enable resonant tunnelling. The electric potential barriers of the charge trapping barrier 30 have resonant energies, indicated by the dotted lines in FIG. 3, which enable the passage of charge carriers at, or substantially at, that those energies through the respective electric potential barrier. The charge trapping barrier 30 is modelled to provide a substantial alignment of resonant energies of the electric potential barriers when a pre-determined electric field is applied across the charge trapping barrier 30. The charge trapping barrier 30 has a thickness that is substantially equal to the thickness of the charge blocking barrier 28.

The memory cell 10 has a write voltage that, when applied between the control gate 24 and the source 12, causes flow of electrons from the control gate 24, through the charge trapping barrier 30, into the floating gate 26. The number of electrons retained within the floating gate 26 when the electric field is removed may be dependent on the form of the floating gate 26. The memory cell 10 also has an erase voltage that, when applied between the control gate 24 and the source 12, causes flow of electrons from the floating gate 26, through the charge trapping barrier 30, into the control gate 24. During storage, the electrons are retained in the floating gate 26, and no voltage is applied to the control gate relative to the source terminal, such that the memory cell stores the one or more bits of information provided by the presence or otherwise of electrons in the floating gate 26.

The threshold voltage ($V_{th}$) of the memory cell 10 is the value of the control gate-source voltage, or the control gate-base terminal voltage, when the conductivity of the conducting channel connecting the source 12 and drain 14 of the memory cell 10 becomes depleted of charge, eg only allowing the inherent leakage current. The memory cell 10 is arranged to provide a change to the threshold voltage when one or more charge carriers, eg electrons, are retained by the floating gate 26.

The memory cell 10 achieves a State "1" when there are charge carriers stored in the floating gate 26, and a State "0" when there are less charge carriers, or no charge carriers, stored in the floating gate 26. In order to read the state of the memory cell 10, a read voltage ($V_{read}$) is applied to the control gate 24, the read voltage ($V_{read}$) being between the first threshold voltage ($V_{th}$) of the memory cell 10 in State "1", and the second, lower, threshold voltage ($V_{th}$) of the memory cell 10 in State "0". The applied read voltage ($V_{read}$) results in a first current at the source 12 and/or drain 14 when the memory cell 10 is in State "1", and no or negligible current when the memory cell 10 is in State "0". The device into which the memory cell is incorporated therefore includes an arrangement for sensing or measuring the current flow between the source and the drain of the memory cell.

The construction and operation of the first embodiment of the memory cell 10 of the present invention is described in more detail below, with reference to FIGS. 2 and 3.

The memory cell 10 is a depletion-mode MOSFET-type device, which is suitable for use in a NAND configuration where memory cells are connected in series. In this embodiment of the cell 10, all operations (read, write, erase) may be performed with the application of less than 3V to the cell 10.

The memory cell 10 is made using III-V compound semiconductors. III-Vs are chosen because of the possibility of changing band parameters, such as the minimum of the conduction band, by varying the composition. GaSb is chosen as the starting point for the active device as Al can be substituted for Ga to produce AlSb, which has a very large band gap, and is almost lattice matched to InAs.

The substrate 16 on which the semiconductor material is grown, for example by solid-source molecular-beam epitaxy, is undoped GaSb. On top of this, a buffer layer of GaSb is grown with a thickness of 200 nm. This is followed by 50 nm of InAs. Since the minimum of the conduction band for InAs lies below the maximum of the valence band for GaSb electrons will flow from the GaSb into the InAs forming the conductive channel (17) for reading out the device.

The charge blocking barrier 28 is formed on top of the channel 17 by 15 nm of AlSb. On top of this, the floating gate 26 is formed by the growth of 11 nm of InAs. Next, the charge trapping barrier 30 is formed by the growth of a series of AlSb and InAs layers to generate two narrow quantum wells of different sizes (3 resonant tunnelling barriers), specifically 1.8 nm of AlSb, 2.4 nm of InAs, 1.2 nm of AlSb, 3.0 nm of InAs, 1.8 nm of AlSb and 7.3 nm of InAs. The quantum wells in the charge trapping barrier 30 are narrow to increase the energies of the lowest confined states, and are different so that these states are not aligned when no voltage is applied to the device.

The last layer to be grown is 200 nm of highly n-doped InAs to form the control gate 24.

After growth, the cell 10 is processed using standard semiconductor lithography techniques. Contacts are made to the source 12, drain 14, control gate 24 and base terminal 15 for the application of voltages and to allow the passage of current through the cell 10. The cell 10 is made sufficiently large (several microns) so that passivation of surface states is not required.

When the cell 10 is not being used, no voltages are applied. In this state the large potential barrier between the floating gate 26 and the channel 17 prevents the passage of charge between them. Similarly, no charge may flow between the floating gate 26 and the control gate 24 because the energies of the confined states in the two quantum wells in the charge trapping barrier 30 are high and are not coincident with each other.

In order to write to the cell 10, the source 12 is shorted to the base terminal 15 contact (ground), and a voltage of about −1.5 V is applied between the control gate 24 and the source 12. This aligns the lowest quantum confined states in the two quantum wells that form part of the charge trapping barrier 30, such that electrons may rapidly pass into (a higher energy state of) the floating gate 26 by the process of resonant tunnelling.

In order to erase the cell 10, the source 12 is shorted to the base terminal 15 (ground), and a voltage of about +2.5 V is applied between the control gate 24 and the source 12. This aligns the lowest confined states in the floating gate 26 and the adjacent quantum wells in the charge trapping barrier 30, such that electrons may rapidly pass out of the floating gate 26 by the process of resonant tunnelling into (a higher energy state of) the other quantum well in the charge trapping barrier 30 and thereafter into the control gate 24.

In order to read the cell 10 without applying a significant voltage between the control gate 24 and the floating gate 26, which are in close proximity, and thereby avoiding the flow of charge between them, the source is not shorted to the base terminal 15. Instead, a voltage of about −0.5 V is applied between the control gate 24 and the base terminal 15, such that in the absence of charge in the floating gate 26 the carriers in the conductive channel 17 are driven into the GaSb substrate 16 giving a reading of '0', and that in the presence of charge in the floating gate 26, the conductive channel 17 is significantly more conductive giving a reading of '1'.

A model of the first embodiment of the memory cell 10 was created in COMSOL using the Coefficient Form PDE (Partial Differential Equation) module in order to describe the changes in the conduction band offset and the coefficient in the PDE due to varying semiconductors. The top half of the structure was modelled, and the conduction band was calculated.

The channel and substrate were removed from the model while write and erase were modelled, as they were not relevant. Energy levels were plotted by finding the domain which had the largest area under the probability density function inside it. This domain would then have a horizontal line plotted at that energy, creating an energy diagram of bound states. Quantum tunnelling is shown when two domains have similar probability density function areas. The percentage difference between the two areas is calculated. If it is less than the value of percentage difference stored in a parameter, both domains will have a horizontal line plotted. This is an easy way to see when resonant tunnelling is occurring. The percentage of probability density function in a given domain can also be plotted, in order to show that an inserted carrier would correctly tunnel through the structure.

Material parameters used by the model can be seen in Table 1.

TABLE 1

The material parameters used in the calculation of the COMSOL model, as given in Vurgaftman (Vurgaftman, J. R. Meyer, L. R. Ram-Mohan, Band parameters for III-V compound semiconductors and their alloys, J. Appl. Phys. 89, 5815 (2001)).

| Parameter | InAs value | AlSb value |
| --- | --- | --- |
| Lattice constant | 0.60583 nm | 0.61355 nm |
| Effective electron mass | 0.026 me | 0.14 me |
| Conduction band offset | −0.236 eV | 1.89 eV |

Figure 4:
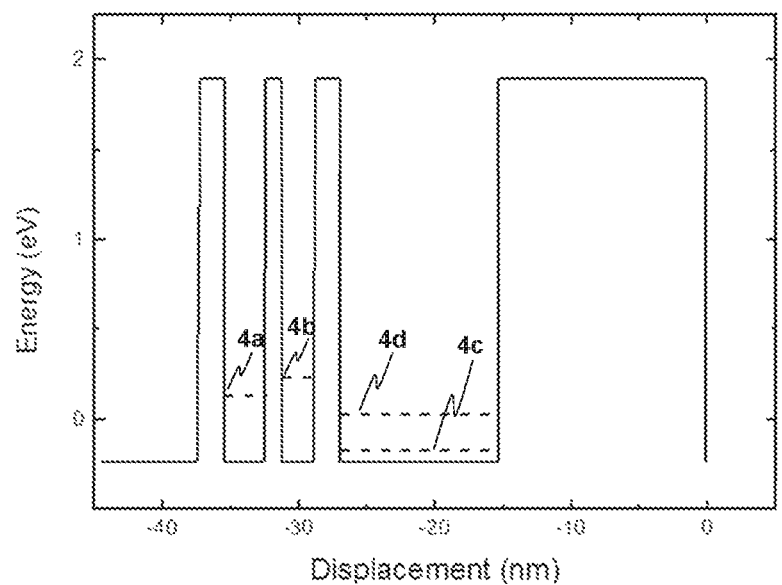
FIG. 4 is a plot of energy levels of the first embodiment at 0V.

The lines that zigzag up and down on each diagram are the conduction band structure, set with 0 to be the valence band offset, the highest point in the valence band of InSb. This leads to a conduction band offset of InAs by −0.236 eV, as seen in FIG. 4. Due to this definition, energies are sometimes negative. These lines are useful in determining where energy levels and wave functions are localised.

No energy states in the control gate channel (furthest on the left) are plotted. Nevertheless, they are still calculated and may have an effect on the leftmost quantum well. The lengths of the domains in the structure are all integer multiples of the lattice constants $a_{InAs}$ and $a_{AlSb}$. From left to right, the lengths are seen in Table 2. Plots for the write and erase steps were taken at particular voltages, where they displayed characteristics which would enable writing or erasing the system.

TABLE 2

The dimensions of the device described. The values used for lattice constants were $a_{InAs}$ = 0.60583 nm and $a_{AlSb}$ = 0.61355 nm, as seen in Table 1.

| Domain name | Length (lattice constants) | Length (4 s.f.) (nm) |
|---|---|---|
| Control gate channel | 12 $a_{InAs}$ | 7.270 |
| Third resonant tunnelling barrier | 3 $a_{AlSb}$ | 1.841 |
| Second potential well | 5 $a_{InAs}$ | 3.029 |
| Second tunnelling barrier | 2 $a_{AlSb}$ | 1.227 |
| First potential well | 4 $a_{InAs}$ | 2.423 |
| First tunnelling barrier | 3 $a_{AlSb}$ | 1.841 |
| Floating gate | 19 $a_{InAs}$ | 11.51 |
| Charge blocking barrier | 25 $a_{AlSb}$ | 15.34 |

The first few eigenvalues have been calculated for each energy band graph, with the probability density function and percentage difference graphs referring only to the coupled energy.

FIG. 4 shows energy levels of the system at 0V (4a-4d), showing no resonant coupling. Carriers can only tunnel out of the floating gate if they have energies equal to or above the energy level 4b in the first quantum well.

Figure 5:
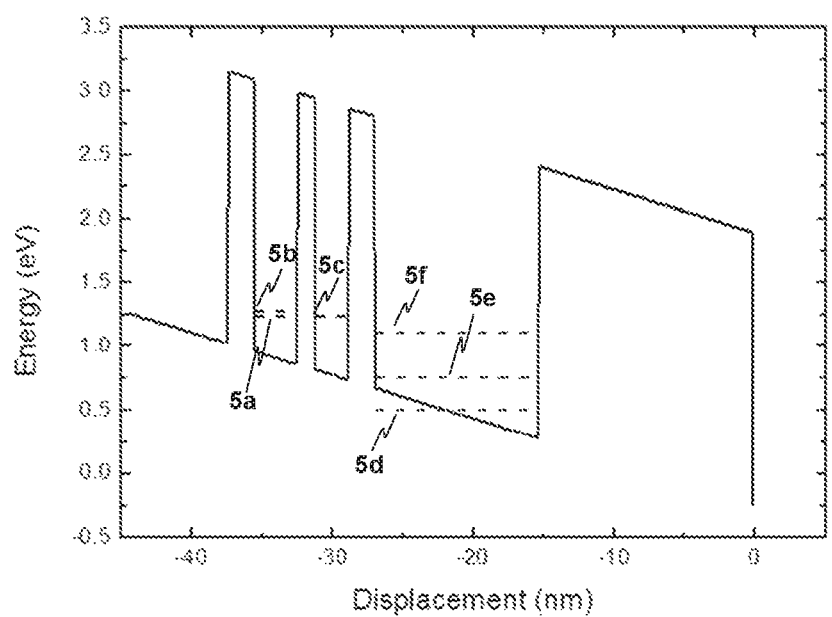
FIG. 5 is a plot of energy levels of the first embodiment at a write voltage.
Figure 6:
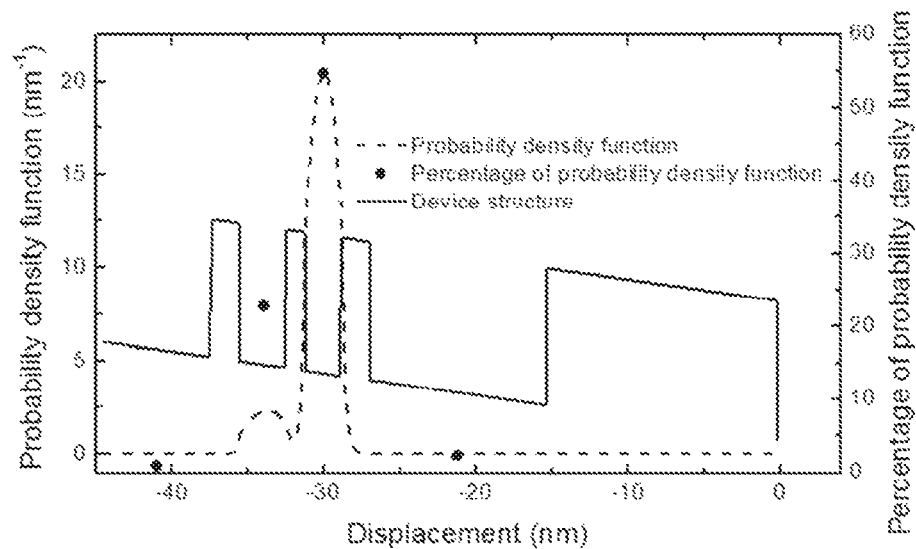
FIG. 6 is a plot of the probability density function and of the percentages of total probability density function area of a pair of coupled energy levels of the first embodiment at the write voltage.

FIG. 5 shows the energy levels at the write voltage of −1.5 V (5a -5f) and where they are localised. The x axis is the displacement into the structure, and the y axis is energy. The coupled energy bands of the system (5a and 5c) are seen to stretch between the two quantum wells. This is helped due to the thinness of the middle barrier. The coupled state energy is less than the voltage across the control gate, the end of the black line on the left. This means that carriers will have enough energy to tunnel through from the left, across the coupled probability density functions. FIG. 6 plots of the probability density function of the pair of coupled energy levels and the percentages of total probability density function area for the pair of coupled energy levels. The percentage area in the floating gate for the pair of coupled energy levels is 2.3%, so carriers may tunnel into the floating gate from states 5a and 5c. Since floating gate states 5d to 5f are at lower energies than 5a and 5c, carriers can relax to those lower energy states and will remain in the floating gate.

Figure 7:
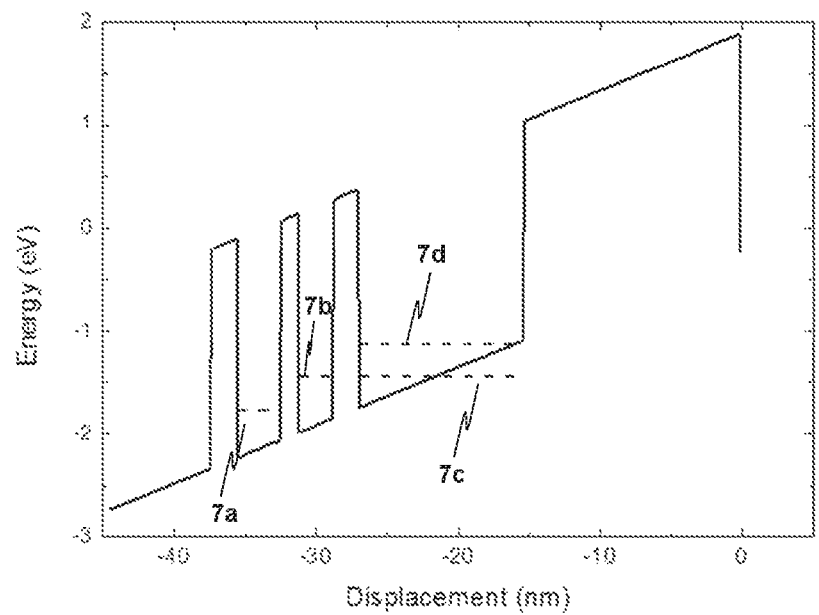
FIG. 7 is a plot of energy levels of the first embodiment at an erase voltage.

FIG. 7 shows the energy levels at the erase voltage of 2.5 V (7a-7d) and where they are localised. There is coupling between the floating gate (energy level 7c) and the first quantum well (energy level 7b), as seen in FIG. 7. This indicates that carriers will move from the floating gate into the first quantum well. As the coupling is taking place with the lowest energy level in the floating gate, all carriers can potentially be removed from the floating gate.

Figure 8:
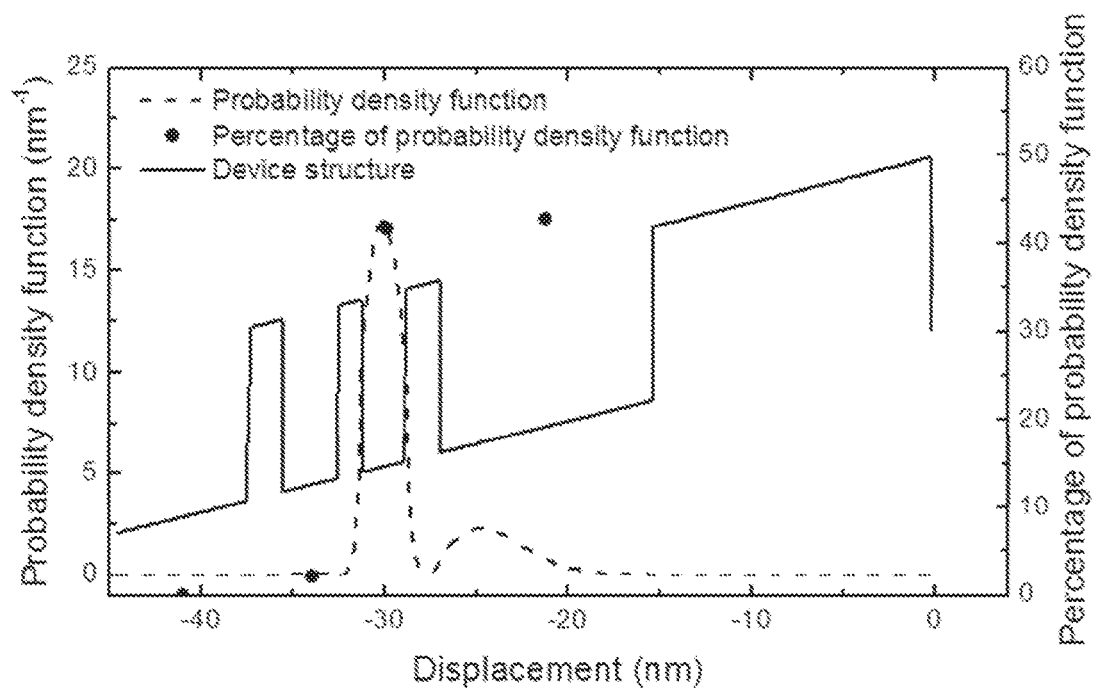
FIG. 8 is a plot of the probability density function and of the percentages of total probability density function area of a pair of coupled energy levels of the first embodiment at the erase voltage.

FIG. 8 is a plot of the probability density function of the coupled energy levels at the erase voltage and of the percentages of total probability density function area for the coupled energy levels at the erase voltage. It can be seen that a small part of the wavefunction of the coupled states 7b and 7c is present in the second quantum well, and that there is a lower energy state 7a for carriers to relax to, assuring efficient removal of charge from the floating gate.

The invention claimed is:

1. A memory cell for storing one or more bits of information, the memory cell comprising a control gate, a source terminal and a drain terminal, a semiconductor substrate between the source and drain terminals, and a floating gate disposed between the control gate and the semiconductor substrate, which is electrically isolated from the control gate by a charge trapping barrier, and which is electrically isolated from the semiconductor substrate by a charge blocking barrier, at least one of the charge trapping barrier and the charge blocking barrier comprising a III-V semiconductor material, wherein the charge trapping barrier is adapted to enable selective passage of charge carriers between the control gate and the floating gate, in use, to modify the one or more bits of information stored by the memory cell, wherein the charge trapping barrier is a resonant tunnelling barrier and the passage of charge carriers between the control gate and the floating gate is by resonant tunnelling.

2. The memory cell of claim 1, wherein the charge trapping barrier comprises at least one electric potential barrier that enables the selective passage of charge carriers between the control gate and the floating gate by controlling the energy of the charge carriers in the control gate and/or floating gate, and/or by controlling the shape and/or magnitude of the at least one electric potential barrier.

3. The memory cell of claim 1, wherein the charge trapping barrier comprises at least one electric potential barrier that has a resonant energy, less than the height of the potential barrier, at which passage of charge carriers between the control gate and the floating gate is enabled.

4. The memory cell of claim 1, wherein the charge trapping barrier comprises at least one electric potential barrier that enables selective intra-band passage of electrons between the control gate and the floating gate in a conduction band.

5. The memory cell of claim 1, wherein the charge trapping barrier has a thickness that is greater than the thickness of the charge blocking barrier.

6. The memory cell of claim 1, wherein the selective passage of charge carriers between the control gate and the floating gate, in use, is controllable by controlling the energy of charge carriers in the control gate and/or the floating gate, and/or by controlling the shape and/or magnitude of one or more electric potential barriers of the charge trapping barrier.

7. The memory cell of claim 1, wherein the passage of charge carriers between the control gate and the floating gate is controllable by the application of an electric field across the charge trapping barrier.

8. The memory cell of claim 1, wherein the charge trapping barrier is adapted to provide a substantial alignment of resonant energies of electric potential barriers in response to a pre-determined electric field being applied across the charge trapping barrier.

9. The memory cell of claim 1, wherein the memory cell has at least one write voltage that, when applied between the control gate and the source, causes flow of charge carriers from the control gate, through the charge trapping barrier, into the floating gate, and the memory cell has at least one erase voltage that, when applied between the control gate and the source, causes flow of charge carriers from the floating gate, through the charge trapping barrier, into the control gate.

10. The memory cell of claim 9, wherein the charge trapping barrier is adapted to prevent charge carriers from entering the floating gate, in the absence of an applied write voltage, and the charge trapping barrier is adapted to prevent charge carriers from leaving the floating gate, in the absence of an applied erase voltage.

11. The memory cell of claim 1, wherein the charge blocking barrier comprises an electric potential barrier that is greater than an electric potential barrier of the charge trapping barrier adjacent to the floating gate.

12. The memory cell of claim 1, wherein a layer of material defining that part of the charge blocking barrier that is adjacent to the floating gate is a wider band gap material than a layer of semiconductor defining that part of the charge trapping barrier that is adjacent to the floating gate.

13. The memory cell of claim 1, wherein the charge blocking barrier is adapted to prevent charge carriers passing between the floating gate and a conductive channel of the semiconductor substrate or, if charge carriers are able to pass between the floating gate and the conductive channel of the semiconductor substrate, this passage of charge carriers does not modify the one or more bits of information stored by the memory cell.

14. The memory cell of claim 1, wherein the charge blocking barrier is an electric potential barrier with a height that is significantly greater than electric potential barriers of the charge trapping barrier.

15. The memory cell of claim 1, wherein the semiconductor substrate comprises a conductive channel, and the channel is a depletion mode channel.

16. A method of manufacturing a memory cell for storing one or more bits of information, the method comprising the steps of:
   (a) providing a control gate, a source terminal and a drain terminal, and a semiconductor substrate between the source and drain terminals, and
   (b) providing a floating gate disposed between the control gate and the semiconductor substrate, which is electrically isolated from the control gate by a charge trapping barrier, and which is electrically isolated from the semiconductor substrate by a charge blocking barrier,
   wherein the charge trapping barrier is adapted to enable the selective passage of charge carriers between the control gate and the floating gate, in use, to modify the one or more bits of information stored by the memory cell, and at least one of the charge trapping barrier and the charge blocking barrier comprises a III-V semiconductor material, and
   wherein the charge trapping barrier is a resonant tunnelling barrier and the passage of charge carriers between the control gate and the floating gate is by resonant tunnelling.

17. The method of manufacturing a memory cell of claim 16, wherein at least the charge trapping barrier and the floating gate are formed epitaxially.

18. The method of manufacturing a memory cell of claim 16, wherein the memory cell being the memory cell of claim 1.

19. A method of operating a memory cell, the method comprising the steps of:
   (a) providing a memory cell as claimed in claim 1; and
   (b) applying an electric field across the charge trapping barrier, such that charge carriers are selectively passed between the control gate and the floating gate, through the charge trapping barrier to modify the one or more bits of information stored by the memory cell.

20. The method of operating a memory cell of claim 19, wherein a potential difference is applied between the control gate and the source terminal and/or a base terminal of the memory cell to apply an electric field across the charge trapping barrier.

21. The method of operating a memory cell of claim 20, wherein a write voltage is applied between the control gate and the source to cause flow of charge carriers from the control gate, through the charge trapping barrier, into the floating gate, and an erase voltage is applied between the control gate and the source to cause a flow of charge carriers from the floating gate, through the charge trapping barrier, into the control gate.

22. The method of operating a memory cell of claim 20, wherein a first information state is achieved when there are charge carriers stored in the floating gate, and a second information state is achieved when there are less charge carriers, or no charge carriers, stored in the floating gate.

23. The method of operating a memory cell of claim 19, wherein a read voltage is applied to the control gate of the memory cell, the read voltage being between a first threshold voltage of the memory cell in a first information state, and a second, different, threshold voltage of the memory cell in a second information state.

24. The method of operating a memory cell of claim 23, wherein the application of the read voltage results in a first current at the source and/or drain when the memory cell is in a first information state, and either a second, different current, or no or negligible current, when the memory cell is in a second information state, and the current flow between the source and the drain of the memory cell is sensed or measured, such that the information state of the memory cell is determined.

* * * * *